United States Patent
Wang et al.

(10) Patent No.: US 9,413,131 B1
(45) Date of Patent: Aug. 9, 2016

(54) LASER TRANSMITTER

(71) Applicants: Hisense Broadband MultiMedia Technologies Co., Ltd., Qingdao, Shandong (CN); Hisense USA Corp., Suwanee, GA (US); Hisense International Co., Ltd., Qingdao, Shandong (CN)

(72) Inventors: Hao Wang, Shandong (CN); Hongwei Mu, Shandong (CN); YungLiang Huang, Shandong (CN); Shun Zhang, Shandong (CN)

(73) Assignees: HISENSE BROADBAND MULTIMEDIA TECHNOLOGIES CO., LTD., Qingdao, Shandong (CN); HISENSE USA CORP., Suwanee, GA (US); HISENSE INTERNATIONAL CO., LTD., Qingdao, Shandong (CN)

( * ) Notice: Subject to any disclaimer, the term of this patent is extended or adjusted under 35 U.S.C. 154(b) by 0 days.

(21) Appl. No.: 14/886,622

(22) Filed: Oct. 19, 2015

(30) Foreign Application Priority Data

Mar. 30, 2015 (CN) .......................... 2015 1 0145276

(51) Int. Cl.
| | |
|---|---|
| *H01S 3/13* | (2006.01) |
| *H01S 3/04* | (2006.01) |
| *H01S 5/0687* | (2006.01) |
| *H01S 5/0683* | (2006.01) |
| *H01S 5/068* | (2006.01) |
| *H01S 5/024* | (2006.01) |

(52) U.S. Cl.
CPC ............... *H01S 3/0405* (2013.01); *H01S 5/024* (2013.01); *H01S 5/02407* (2013.01); *H01S 5/02415* (2013.01); *H01S 5/068* (2013.01); *H01S 5/0687* (2013.01); *H01S 5/06837* (2013.01)

(58) Field of Classification Search
CPC ... H01S 5/0687; H01S 5/06837; H01S 5/068; H01S 5/02407; H01S 5/02415; H01S 5/024
USPC ..................................... 372/29.02, 31, 32, 36
See application file for complete search history.

(56) References Cited

U.S. PATENT DOCUMENTS

| | | | | |
|---|---|---|---|---|
| 5,875,204 A | * | 2/1999 | Sato ...................... | H01L 33/645 372/34 |
| 7,751,458 B2 | * | 7/2010 | Regaard ................ | H01S 5/4012 372/101 |
| 9,335,022 B2 | * | 5/2016 | Lee ...................... | F21S 48/1208 |
| 2003/0214031 A1 | * | 11/2003 | Onoue ................ | H01S 5/02415 257/734 |

* cited by examiner

*Primary Examiner* — Kinam Park
(74) *Attorney, Agent, or Firm* — Brinks Gilson & Lione

(57) ABSTRACT

A laser transmitter includes a heat sink, a laser disposed on the heat sink, and a connection apparatus. The connection apparatus includes: a lower substrate and an upper substrate disposed on the lower substrate. An upper surface of the lower substrate is disposed with a first conductor, and a lower surface thereof is disposed with a second conductor. The upper substrate has an upper surface disposed with a third conductor, where the third conductor is connected to the second conductor. The heat sink is disposed on a side of the lower substrate that is close to an end of the first conductor. The laser is connected to an end of the first conductor that is close to the heat sink.

12 Claims, 9 Drawing Sheets

LASER TRANSMITTER

CROSS-REFERENCE TO RELATED APPLICATION

This application claims priority to Chinese Patent Application No. 201510145276.3, filed on Mar. 30, 2015, which is hereby incorporated by reference in its entirety.

TECHNICAL FIELD

The present disclosure relates to the field of laser technology display, and in particular, to a laser transmitter.

BACKGROUND

As shown in FIG. 1, an existing laser transmitter includes a fiber adapter 101, a cavity 102, and pins 103 and 104. Electronic devices of the laser transmitter include a laser and other electric device located in the cavity; light emitted by the laser enters a fiber by using the fiber adapter; the pins 103 and 104 are welded on opposite surfaces of a same ceramic substrate; and the pins supply power for the laser and the other electric device by means of connection to an external circuit.

As shown in FIG. 2, an interior of the cavity includes a heat sink 201, a laser 204, and ceramic substrates 202 and 203. A surface of the heat sink 201 is pasted with a conducting layer, and a cathode of the laser 204 is laminated to the conducting layer; a surface of the laser 204 has an anode welding point 206, and a conducting strip insulted with the conducting layer is disposed between the laser and the other end of the heat sink; a surface of the ceramic substrate 202 has a conductor 205A; the conductor 205A is welded with the pin 103; a surface of the ceramic substrate 203 has a conductor 205C; and the conducting layer is located in a same horizontal plane as the surface of the ceramic substrate 203 having the conductor 205C.

As shown in FIG. 3, FIG. 4, and FIG. 5, a conductor 205B on a surface of the ceramic substrate 202 is welded with the pin 104; the pin 103 and the pin 104 are welded on opposite surfaces of the ceramic substrate 202; the surface of the ceramic substrate 203 has the conductor 205C; and the surface having the conductor 205B is laminated to the surface having the conductor 205C, so that conductors 205B and 205C on two surfaces abut. However, high-speed signal transmission demands that the laser transmitter meets an impedance matching requirement needed by a high frequency signal. Impedance matching, as a part of microwave electronics, is mainly used for a transmission line, so as to achieve an objective that all high frequency microwave signals can be transmitted to a point of load and no signal is transmitted back to a source point, thereby improving quality of the high frequency signal.

As shown in FIG. 5, owing to a narrow conductor and a limited manufacturing technology, this transit connection manner makes the conductors 205B and 205C staggered during abutting, which causes a large error. Existence of the error destroys impedance matching preset for the high frequency signal, so that the high frequency signal provided by means of the conductor 205C, the conductor 205B, and the pin 104 for the laser 204 does not satisfy the impedance matching requirement.

As shown in FIG. 2, if the high frequency signal is provided for the laser 204 by means of the conductor 205A, the conductor 205C, the conductor 205B, and the pin 104 supply power for the other electric device. In order to connect the other electric device to the conductor 205C, a gap needs to be set on the ceramic substrate 202. When the cathode of the laser 204 is connected to the conductor 205A by means of a gold wire through the conducting layer, the anode welding point, and the conducting strip, owing to existence of the gap and that the conducting layer and the conducting strip, and the conductor 205A are located in two planes with two different heights, causing a large distance between the conducting layer and the conducting strip, and the conductor 205A, and a needed gold wire of a long length, so that the high frequency signal provided by means of the conductor 205A for the laser 204 does not satisfy the impedance matching requirement.

SUMMARY

The present disclosure provides a laser transmitter. As compared with the prior art, the laser transmitter facilitates implementation of connection that satisfies an impedance matching requirement formed between a laser and a first conductor.

In order to achieve the foregoing objective, the present disclosure provides the following solutions. In a first aspect, a laser transmitter includes a heat sink, a laser disposed on the heat sink, and a connection apparatus. The connection apparatus includes: a lower substrate and an upper substrate disposed on the lower substrate. The lower substrate includes an upper surface thereof being disposed with a first conductor, and a lower surface thereof being disposed with a second conductor. The upper substrate includes an upper surface thereof being disposed with a third conductor, where the third conductor is connected to the second conductor. The heat sink is disposed on a side of the lower substrate that is close to an end of the first conductor. The laser is connected to an end of the first conductor that is close to the heat sink.

BRIEF DESCRIPTION OF THE DRAWINGS

To illustrate the technical solutions in the embodiments of the present disclosure more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

Figure 1:
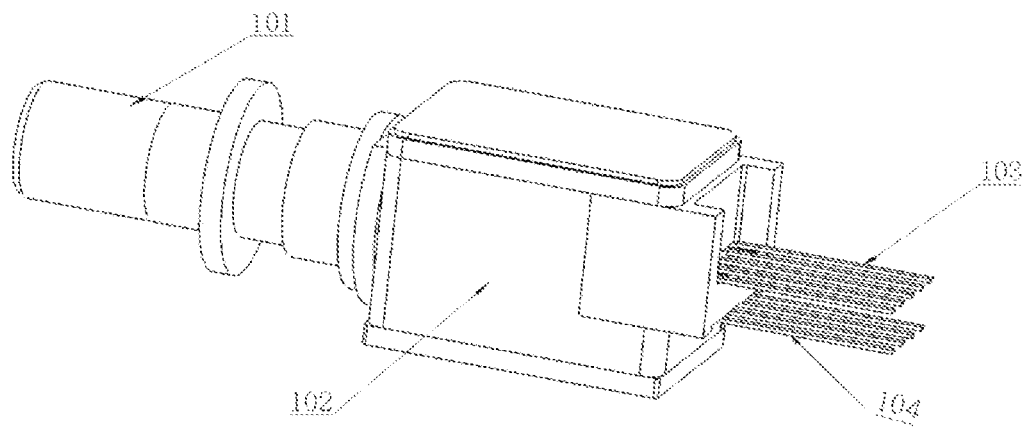
FIG. 1 is a schematic diagram of an existing laser transmitter.
Figure 2:
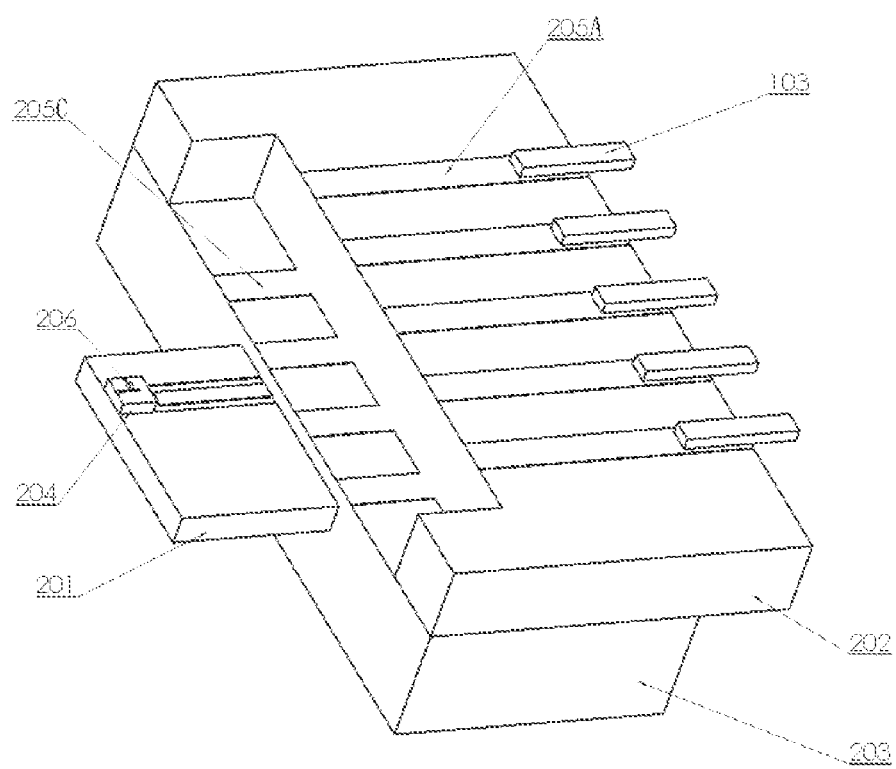
FIG. 2 is a schematic diagram of an internal structure of a cavity of the laser transmitter shown in FIG. 1.
Figure 3:
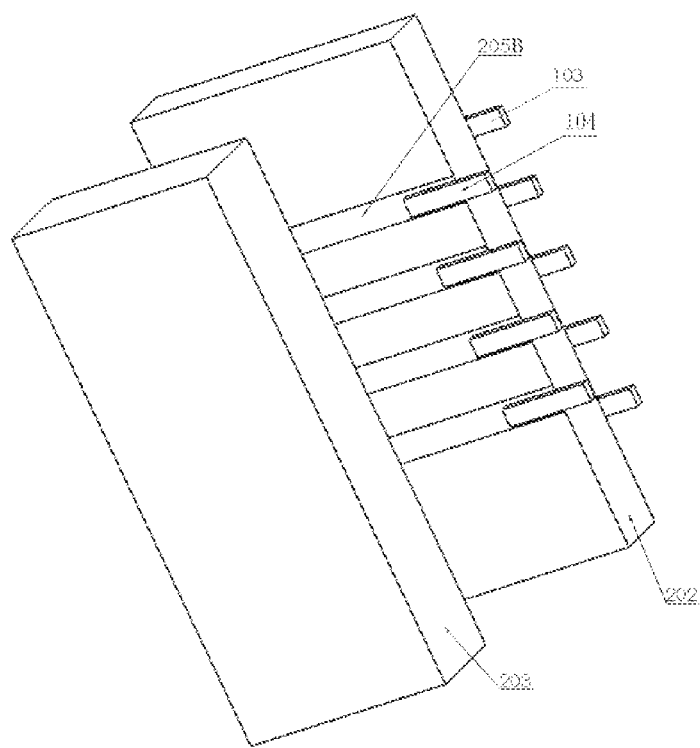
FIG. 3 is a schematic diagram of a connection relationship of a ceramic substrate shown in FIG. 2.
Figure 4:
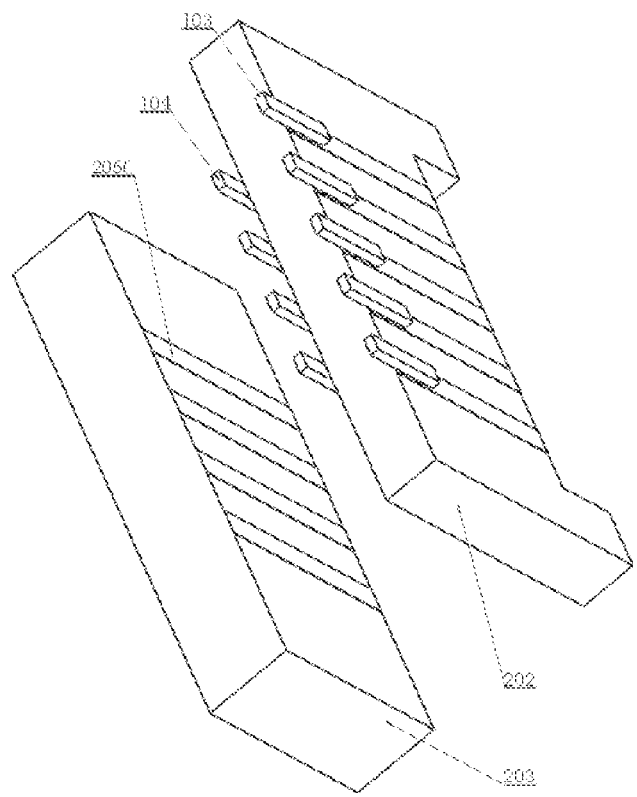
FIG. 4 is a view of the ceramic substrate connection relationship shown in FIG. 2, from another angle.
Figure 5:
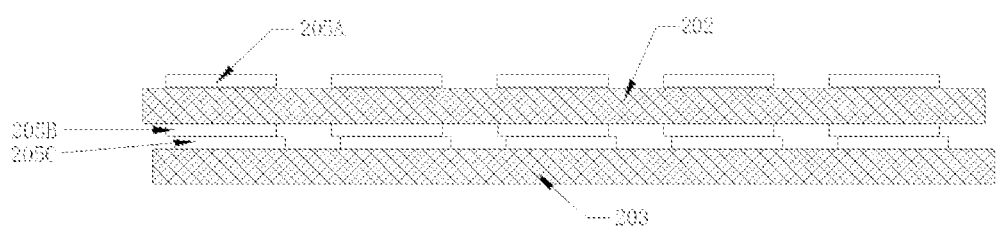
FIG. 5 is a view of the ceramic substrate connection relationship shown in FIG. 2, from still another angle.

REFERENCE NUMERALS AND DESCRIPTION OF MAIN ELEMENTS in the related art:
201 heat sink, 202 and 203 ceramic substrate, 204 laser, 205 A, 205 B, and 205 C conductor, 206 anode welding point, and 103 and 104 pin; and
in the present disclosure:
100 heat sink, 110 conducting layer, 120 conducting strip, 200 laser,
310 lower substrate, 311 first connection hole, 320 upper substrate, 321 second connection hole,
330 upper plate, 331 upper plate through hole, 340 lower plate, 341 lower plate through hole
410 first conductor, 420 second conductor, 430 third conductor, 440 transfer conductor, and
500 pin.

DETAILED DESCRIPTION

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. section 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue.

The following clearly and completely describes the technical solutions in the embodiments of the present disclosure with reference to the accompanying drawings in the embodiments of the present disclosure. Apparently, the described embodiments are some of the embodiments of the present disclosure rather than all of the embodiments. All other embodiments obtained by a person of ordinary skill in the art based on the embodiments of the present disclosure without creative efforts shall fall within the protection scope of the present disclosure.

In the description of the present disclosure, it should be understand that positions and positional relationships indicated by the terms such as "center", "above", "below", "in front of", "behind", "left", "right", "vertical", "horizontal", "top", "bottom", "inside", "outside" are based on the position or positional relationship shown in the accompany drawings, which are used only for convenient and brief description, and do not indicate or imply that the indicated apparatus or element must be in a specific position, and must be constructed and operated in a specific position. In addition, in embodiments of the present disclosure, an inner end and an outer end are both defined according to directions of signals in a transmission path, that is, according to directions of signals in a transmission path, one end for inputting signals is defined as the outer end or a signal input end of the transmission path, and another end for outputting signals is defined as the inner end or a signal output end. Of course, other names may be defined according to principles, and thus the foregoing cannot be understood as a limitation on the present disclosure.

In a laser transmitter according to the present disclosure, a laser and a first conductor are connected to form a first circuit. The first circuit of the laser transmitter may meet a required impedance matching requirement by adjusting a length of the first conductor. A heat sink is disposed on a side of a lower substrate that is close to an end of the first conductor, so that a distance between the laser and an end of the first conductor that is close to the heat sink is small, which facilitates implementation of connection that satisfies an impedance matching requirement formed between the laser and the end of the first conductor that is close to the heat sink. A third conductor and a second conductor are connected to form a second circuit, and the second circuit is connected to other electric device of the laser transmitter.

The following further clearly describes the technical solutions in the embodiments of the present disclosure in detail with reference to the accompanying drawings. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

A laser transmitter according to a first embodiment of the present disclosure, as shown in FIG. 6, FIG. 7, FIG. 8, and FIG. 9, includes a heat sink 100, a laser 200 disposed on the heat sink 100, and a connection apparatus. The connection apparatus includes: a lower substrate 310 and an upper substrate 320 disposed on the lower substrate.

Figure 10:
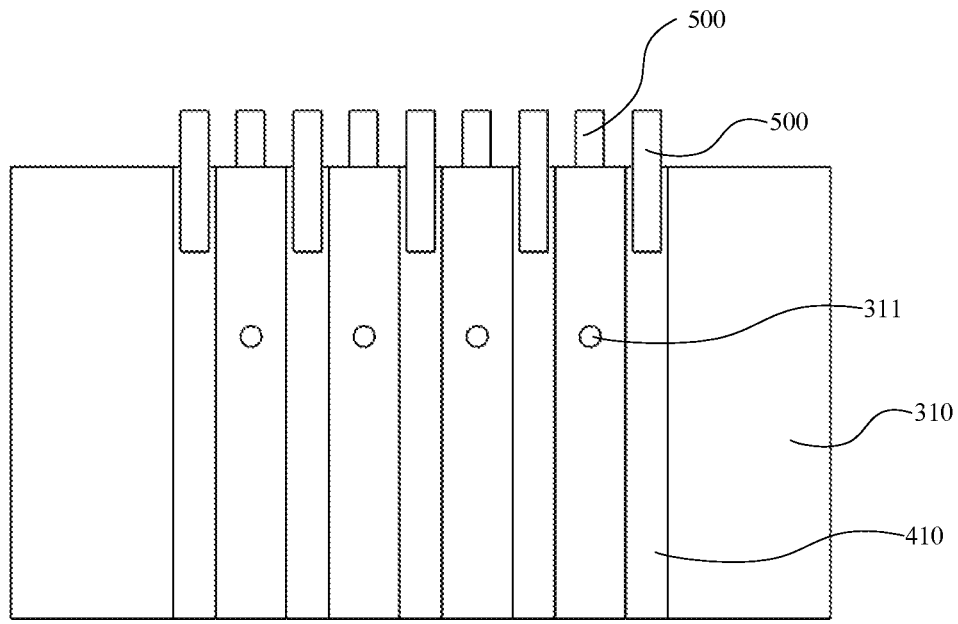
FIG. 10 is a top view of a lower substrate of a connection apparatus of the laser transmitter shown in FIG. 6.
Figure 11:
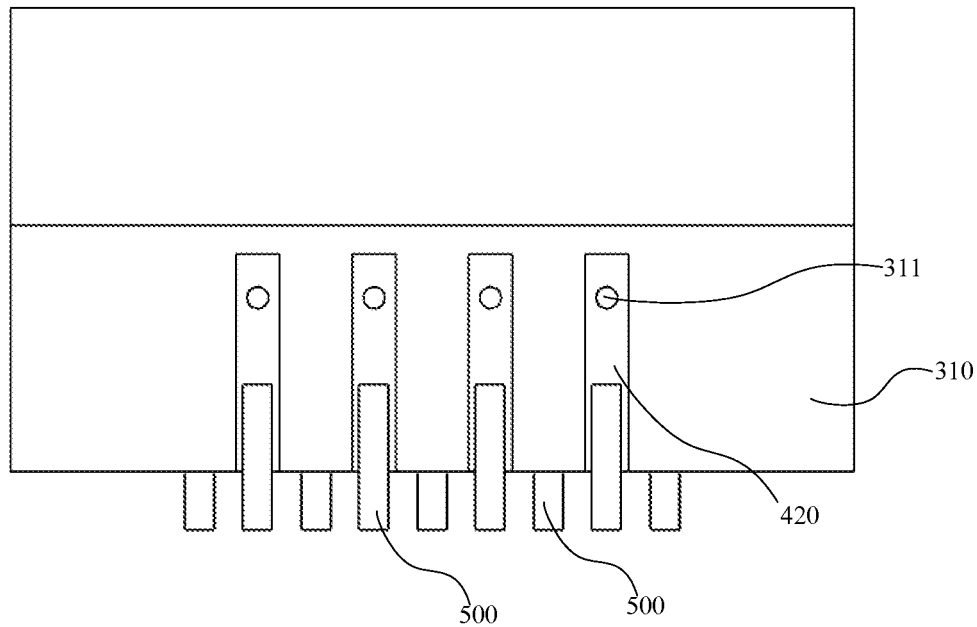
FIG. 11 is a bottom view of the lower substrate of the connection apparatus of the laser transmitter shown in FIG. 10.

As shown in FIG. 10 and FIG. 11, five first conductors 410 are disposed on an upper surface of the lower substrate 310. Four second conductors 420 are disposed on a lower surface of the lower substrate 310. Tail ends of the first conductors and the second conductors are separately connected to pins 500.

Figure 12:
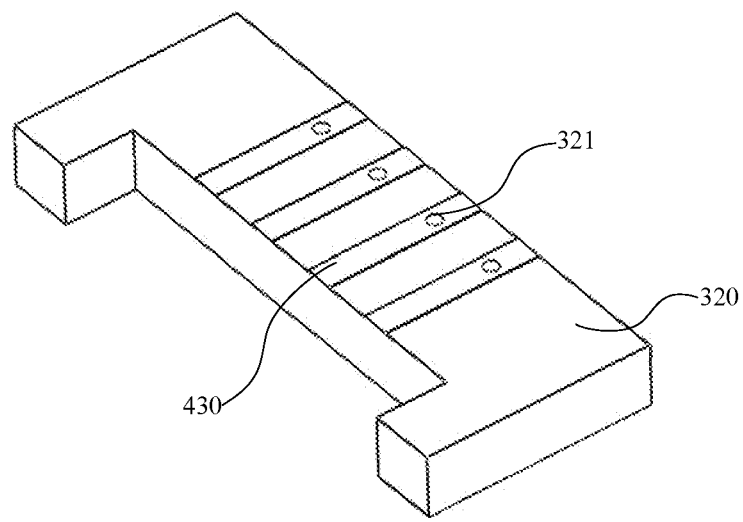
FIG. 12 is a schematic diagram of an upper substrate of a connection apparatus of the laser transmitter shown in FIG. 6.
Figure 13:
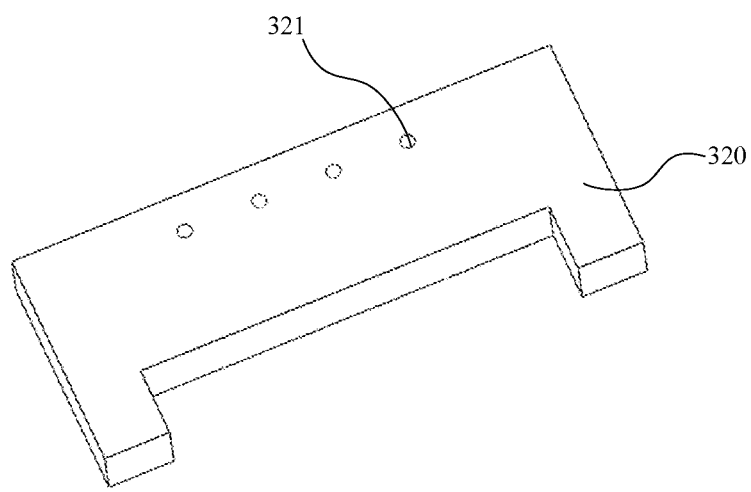
FIG. 13 is a schematic diagram of the upper substrate of the connection apparatus of the laser transmitter shown in FIG. 12, from another angle.

The upper substrate 320 is disposed on the lower substrate, as shown in FIG. 12 and FIG. 13. An upper surface thereof is disposed with a third conductor 430 that has one-to-one correspondence to the second conductor, and the third conductor 430 is connected to the second conductor 420 corresponding thereto.

The heat sink 100 is disposed on a side of the lower substrate that is close to a head end of the first conductor 410. The laser 200 is connected to the head end of the first conductor 410. Other electronic devices of the laser transmitter may be connected to the third conductor, where the upper substrate and the lower substrate can use ceramic substrates.

In this way, the laser is connected to the head end of the first conductor, and the tail end of the first conductor is connected to the pin to form a first circuit; the other electric device of the laser transmitter is connected to the third conductor, the third conductor is corresponding to the second conductor corresponding thereto, the tail end of the second conductor is connected to the pin to form a second circuit, where the pins supply power for the laser and the other electric device by means of connection to an external circuit.

Electronic devices inside the laser transmitter include the laser and the other electric device. The laser is an apparatus for generating laser light and is used as a transmission source of the laser light. A great amount of heat may be generated in a process that the laser generates the laser light. In order to avoid an excessively high temperature of the laser, the laser is generally disposed on the heat sink. A function of the heat sink is to cool the laser.

In order to work, the laser and the other electric device need to form a conductive path with the external circuit. In order to form the conductive path, the laser transmitter needs to include the connection apparatus and connect the laser and the other electric device to the external circuit by means of the connection apparatus. The laser transmitter should form at least two types of conductive lines. The first conductive line is a line connected to the laser; and the second conductive line is a line connected to the other electric device. In this embodiment, the laser and the first conductor are connected to form the first circuit, and the other electric device, the second conductor, and the third conductor are connected to form the second circuit; and the respective number of the two lines may be set according to needs.

According to a requirement on a package structure of the laser transmitter, the connection apparatus needs to be implemented by means of a double panel structure set up and down. For example, the connection apparatus in this embodiment is implemented by means of the upper substrate and the lower substrate set up and down. In this embodiment, the laser and the first conductor that is located on the upper surface of the lower substrate are connected to form the first circuit, and the other electric device, the second conductor that is located on the lower surface of the lower substrate, and the third conductor that is located on the upper surface of the upper substrate are connected to form the second circuit; and meanwhile, the heat sink is disposed on the side of the lower substrate that is close to the head end of the first conductor. Reasons for making such choices are as follows:

High-speed signal transmission demands that a line of the laser transmitter meets an impedance matching requirement needed by a high frequency signal. Impedance matching, as a part of microwave electronics, is mainly used for a transmission line, so as to achieve an objective that all high frequency microwave signals can be transmitted to a point of load and no signal is transmitted back to a source point, thereby improving quality of the high frequency signal. A line may meet the impedance matching requirement by adjusting a length of the transmission line. In the laser transmitter in this embodiment, the first circuit of the laser transmitter may meet a required impedance matching requirement by adjusting a length of the first conductor. Meanwhile, a heat sink is disposed on a side of a lower substrate that is close to a head end of the first conductor, so that a distance between the laser and the head end of the first conductor is small, which facilitates implementation of connection that satisfies an impedance matching requirement formed between the laser and the head end of the first conductor.

The first conductor on the upper surface of the lower substrate and the second conductor on the upper surface of the upper substrate are connected by means of the electric device of the laser transmitter. The heat sink is disposed on the side of the lower substrate that is close to the head end of the first conductor, which facilitates connection between the electric device of the laser transmitter, the first conductor, and the second conductor on the upper substrate.

It should be noted that the numbers of the first conductor and the second conductor are not limited to the foregoing numbers, and may be adjusted according to needs of the laser transmitter. The numbers herein are only described for exemplary purposes.

Figure 6:
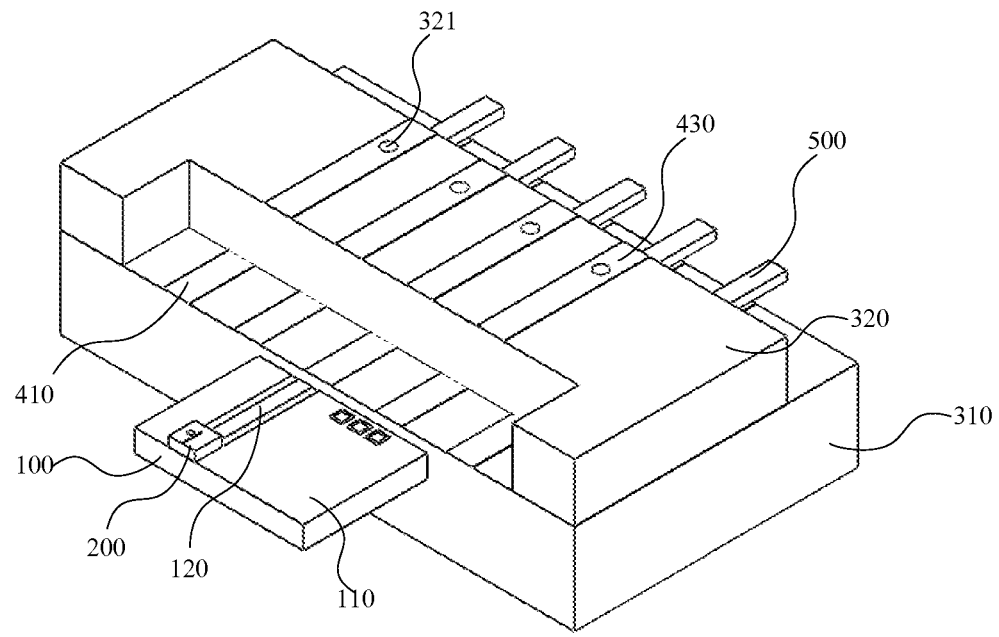
FIG. 6 is a schematic diagram of an internal structure of a laser transmitter according to an embodiment of the present disclosure.

As a specific implementation manner, as shown in FIG. 6, the laser 200 is set in a location on the heat sink 100 that is far from the head end of the first conductor 410. In this way, the heat generated by the laser has a slight impact on the first conductor.

As a specific implementation manner, the lower surface 310 further includes a first connection hole 311. The upper substrate 320 further includes a second connection hole 321. The third conductor 430 is connected to the second conductor 420 corresponding thereto by means of a conducting wire passing through the second connection hole 321 and the first connection hole 311.

In this way, connection between the third conductor and the second conductor corresponding thereto is conveniently implemented by means of the first connection hole of the lower substrate, the second connection hole of the upper substrate, and the conducting wire. The first connection hole and the second connection hole are respectively formed inside the lower substrate and the upper substrate. The conducting wire passes through the first connection hole and the second connection hole to make connected, so that there is no conducting wire in the outer side of the connection apparatus, and a whole is concise.

As a preferred manner, the laser may be connected to the head end of the first conductor by means of a gold wire.

The gold wire has a function of conducting wire connection between the laser and the head end of the first conductor. When a current is conducted, the current enters the laser by means of the gold wire to enable the laser. The gold wire has advantages such as high conductivity, corrosion resistance, and good toughness. Compared to other material, one of the biggest advantages of the gold wire is antioxidation. Compared to the existing technology, the distance between the laser of the laser transmitter in this embodiment and the head end of the first conductor is small, and connection may be implemented by means of a short gold wire, thereby saving money and reducing costs.

Figure 7:
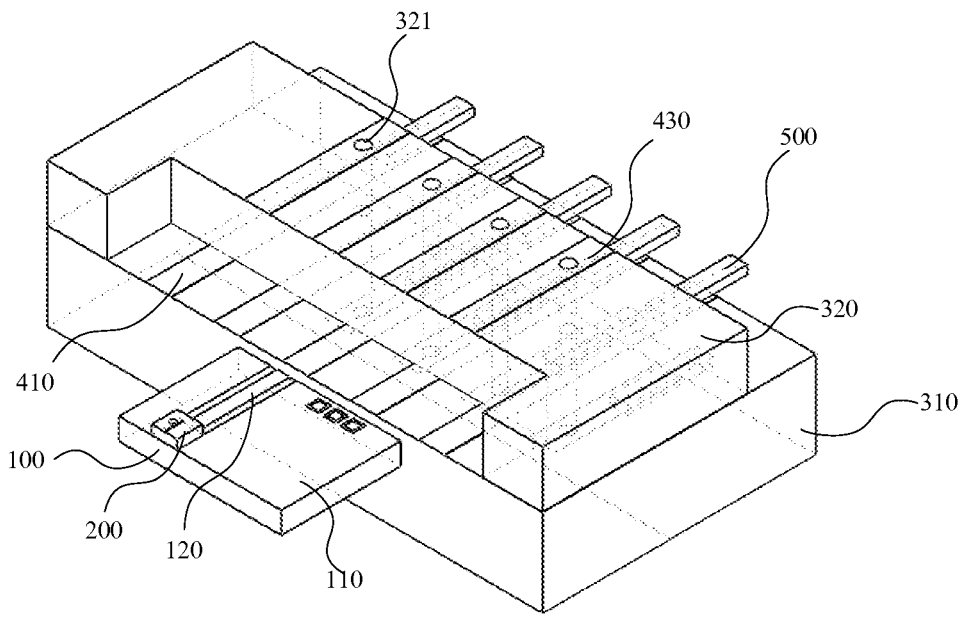
FIG. 7 is a perspective view of the internal structure of the laser transmitter shown in FIG. 6.
Figure 8:
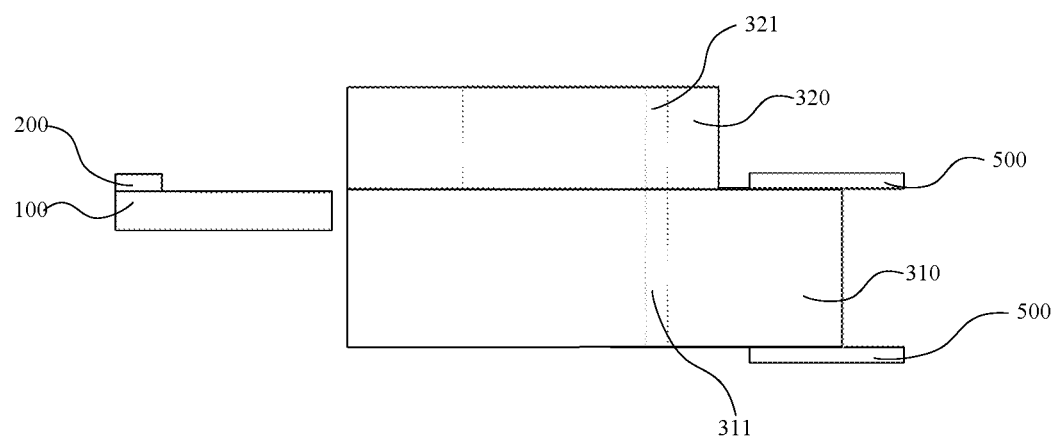
FIG. 8 is a side perspective view of the internal structure of the laser transmitter shown in FIG. 6.
Figure 9:
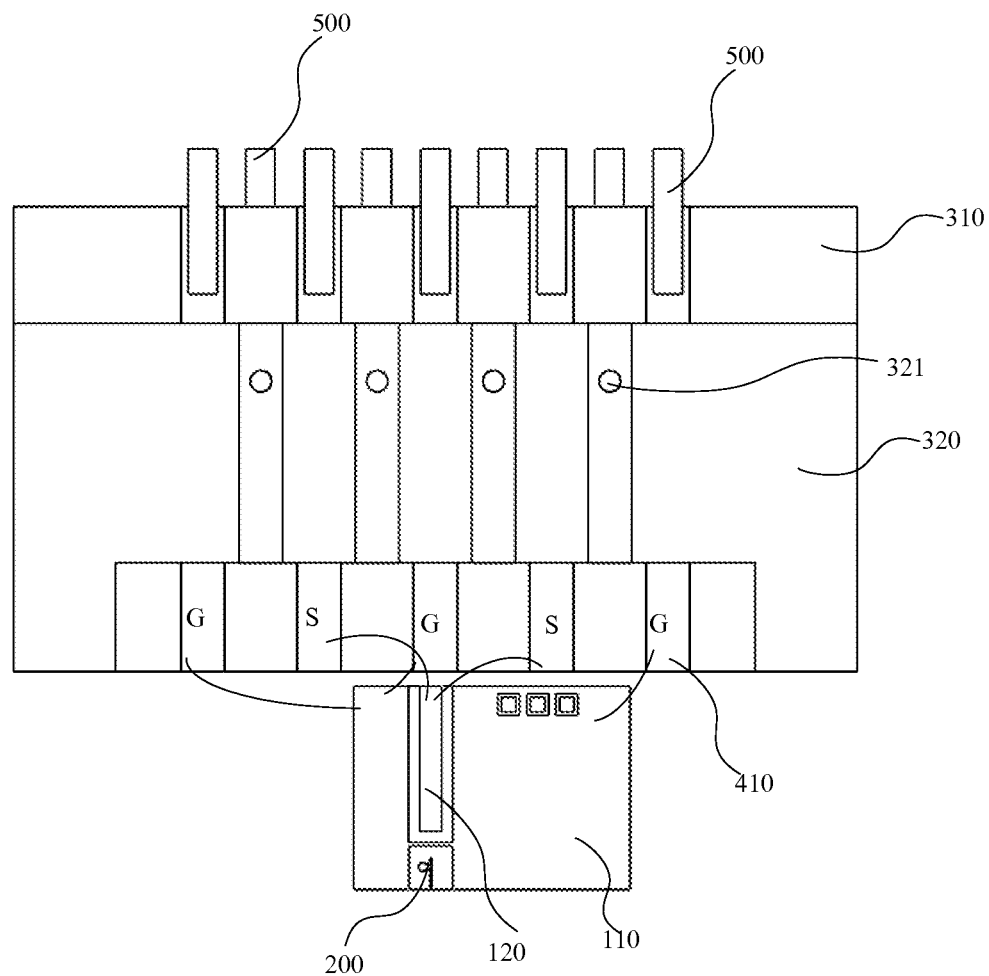
FIG. 9 is a top view of the internal structure of the laser transmitter shown in FIG. 6.

In a manner in which the laser is connected to the head end of the first conductor by means of the gold wire, because costs of money are high, the distance between the laser and the head end of the first conductor needs to be short, so as to shorten a length of the gold wire, reduce costs, and improve the quality of the high frequency signal. For example, the following manner may be used:

As shown in FIG. 6, FIG. 7, and FIG. 9, a conducting layer 110 is formed on the upper surface of the heat sink 100, the conducting layer 110 and the first conductor 410 of the lower substrate are located in a same plane; a cathode of the laser is disposed on the conducting layer 110 and a surface of the laser has an anode welding point, and a conducting strip 120 insulted with the conducting layer is disposed between the laser and the other end of the heat sink; and the anode welding point of the laser is connected to the conducting strip 120 by means of the gold wire, and the conducting strip 120 and the conducting layer 110 are connected to the head end of the first conductor 410 by means of the gold wire.

In this way, connection between the cathode of the laser and the head end of the first conductor is implemented by fixing the cathode of the laser on the conducting layer, and then connecting the conducting layer and the first conductor that are located in the same plane by means of the gold wire; and connection between the anode welding point of the laser and the head end of the first conductor is implemented by connecting the anode welding point of the laser to the conducting strip by means of the gold wire, and then connecting the conducting strip to the first conductor by means of the gold wire. Owing to existence of the conducting layer and the conducting strip and that the conducting layer and the first conductor are located in the same plane, a distance between the conducting layer, the conducting strip, and the first conductor is very small, and a distance between the anode welding point of the laser and the conducting strip is also very small. That is, distances that need to be connected by using the gold wire are both very small, shortening the length of the needed gold wire, saving money, and reducing costs.

Further, as shown in FIG. 6, FIG. 7, FIG. 8, and FIG. 9, the first connection hole 311 and the second connection hole 321 are through holes; the first connection hole 311 has one-to-one correspondence to the second conductor 420; the second connection hole 321 has one-to-one correspondence to the third conductor 430; and the third conductor 430 is connected to the second conductor 420 corresponding thereto by means of the conducting wire passing through the corresponding second connection hole 321 and the first connection hole 311, where the corresponding second connection hole and the first connection hole are the second connection hole and the first connection hole that are respectively corresponding to the third conductor and the second conductor corresponding thereto.

In this way, connection between each third conductor and a second conductor corresponding thereto is implemented by means of a conducting wire passing through the corresponding second connection hole and the first connection hole, so that connection between the third conductor and the second conductor corresponding thereto becomes more concise, and assembling of the laser transmitter becomes simpler and easier.

Further, as shown in FIG. 6, FIG. 7, FIG. 8, FIG. 9, and FIG. 11, an opening of the first connection hole 311 on the lower surface of the lower substrate forms at the second conductor 420 corresponding thereto; and as shown in FIG. 6, FIG. 7, FIG. 8, FIG. 9, and FIG. 12, an opening of the second connection hole 321 on the upper surface of the upper substrate forms at the third conductor 430 corresponding thereto.

In this way, after threading through the first connection hole and the second connection hole, the conducting wire may be directly connected to a third conductor path and the second conductor. Lengths of wires may be short, so that meanwhile, the connection between the third conductor and the second conductor corresponding thereto becomes more concise, and assembling of the laser transmitter becomes simpler and easier.

Further, as shown in FIG. 6, FIG. 7, FIG. 8, FIG. 9, and FIG. 10, an opening of the first connection 311 hole on the upper surface of the lower substrate is staggered with the first conductor 410. In this way, the first connection hole has no impact on the first conductor, which avoids that the high-speed signal provided for the laser does not satisfy the impedance matching requirement.

As shown in FIG. 6, FIG. 7, FIG. 8, and FIG. 9, the second connection hole 321 and the first connection hole 311 are straight up-and-down holes, and the second connection hole 321 is located over the first connection hole 311 corresponding thereto.

In this way, after the corresponding first connection hole and second connection hole are threaded through, a length of a conducting wire connecting the third conductor and the second conductor corresponding thereto is the shortest, which can reduce costs. Meanwhile, structures of the upper substrate and the lower substrate are simple, which is easy for manufacturing and assembling.

It should be noted that the second connection hole and the first connection hole are the straight up-and-down holes, and the second connection hole is located over the first connection hole corresponding thereto, which is merely a specific implementation form, and is only described for exemplary purposes, as long as the third conductor is connected to the second conductor corresponding thereto by means of the conducting wire threading through the second connection hole and the first connection hole. As an optional manner, the corresponding first connection hole and second connection hole being through may also implement electrical connection between the third conductor is connected to the second conductor corresponding thereto by means of the conducting wire threading through the second connection hole and the first connection hole.

For example, as shown in FIG. 6, FIG. 7, and FIG. 9, the number of the first conductor 410 is odd.

As shown in FIG. 9, when the laser is a direct modulated laser, the first conductor is used for connection of the high frequency signals; and numbering starts from a side of the first conductors. A first conductor that is numbered as an odd number is connected to the conducting layer by means of the gold wire and used as a ground wire, and a first conductor that is numbered as an even number is connected to the conducting layer by means of the gold wire and used as a signal wire.

For the direct modulated laser, drive can be implemented just by providing the high frequency signal, and the first conductor being connected to the high frequency signal. The foregoing connection manner meets a rule that two ground wires (represented by using G) packs one signal wire (represented by using S), which needs to be followed for laser high frequency signal connection, and a common connection manner includes GSG and GSGSG.

When the laser is an indirect modulated laser, the first conductor is used for connection between the high frequency signal and a direct current signal; and numbering starts from a side of the first conductors. The outermost first conductor that is numbered as an odd number is configured to connect the direct current signals; other first conductor that is numbered as an odd number is connected to the conducting layer by means of the gold wire and used as the ground wire; and a first conductor that is numbered as an even number is connected to the conducting layer by means of the gold wire and used as the signal wire.

For the indirect modulated laser, not only the high frequency signal needs to be provided, but also the direct current signal needs to be provided to implement the drive. The direct current signal is mainly used for supplying power for a semiconductor cooler inside the laser transmitter, backhaul of a thermal resistor signal, and backhaul of a detection current of a back-light detection unit. The foregoing connection manner meets a rule that two ground wires (represented by using G) packs one signal wire (represented by using S), which needs to be followed for providing the high frequency signal and the direct current signal for the indirect modulated laser, and meanwhile for laser high frequency signal connection, and a common connection manner includes GSG and GSGSG.

Figure 14:
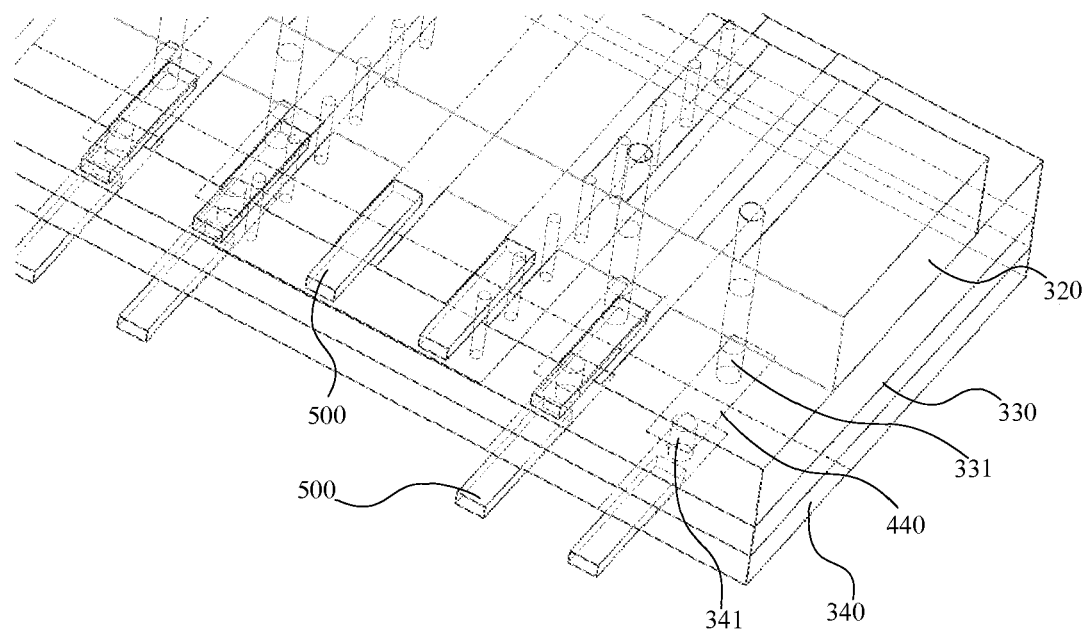
FIG. 14 is a perspective view of an internal structure of a laser transmitter according to another embodiment of the present disclosure.
Figure 15:
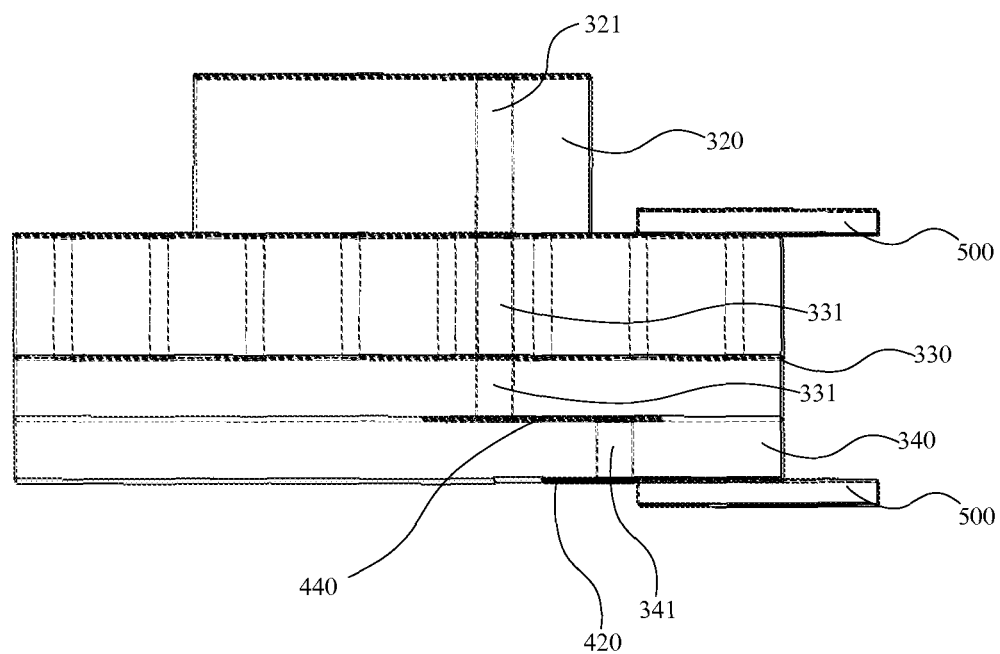
FIG. 15 is a side perspective view of the internal structure of the laser transmitter shown in FIG. 14.

A laser transmitter according to a second embodiment of the present disclosure differs from the laser transmitter according to the first embodiment in that:

As shown in FIG. 14 and FIG. 15, the lower substrate includes a upper plate 330 and a lower plate 340, and a transfer conductor 440 that has one-to-one correspondence to the second conductor is disposed between the upper plate and the lower plate.

The first connection hole 311 has one-to-one correspondence to the second conductor 420. Each of the first connection holes includes an upper plate through hole 331 and a lower plate through hole 341 staggered therewith; and the second connection hole 321 is a through hole and has one-to-one correspondence to the third conductor 430.

The third conductor 430 is connected to the transfer conductor 441 corresponding thereto by means of the conducting wire passing through the corresponding second connection hole 321 and upper plate through hole 331, and the transfer conductor 440 is connected to the second conductor 420 corresponding thereto by means of the conducting wire passing through the lower plate through hole 341 corresponding to the second conductor.

The upper plate through hole is a through hole formed inside the upper plate, and the lower plate through hole is a through hole formed inside the lower plate. The corresponding third conductor and transfer conductor are corresponding to a same second conductor, and the corresponding second connection hole and upper plate through hole are the second connection hole and the upper plate through hole of the first connection hole that are respectively corresponding to the third conductor and the second conductor corresponding thereto.

In the laser transmitter in this embodiment, the third conductor is connected to the transfer conductor corresponding thereto by means of the conducting wire passing through the corresponding second connection hole and upper plate through hole1, and the transfer conductor is connected to the second conductor corresponding thereto by means of the conducting wire passing through the lower plate through hole corresponding to the second conductor. Existence of the transfer conductor enables a location relationship between the upper plate through hole and the lower plate through to be set according to needs, so as to adapt to packaging requirements of different laser transmitters.

Further, as shown in FIG. 14 and FIG. 15, an opening of the lower plate through hole 341 on a lower surface of the lower plate forms at the second conductor 420 corresponding thereto, and an opening of the second connection hole 321 on the upper surface of the upper substrate forms at the third conductor 430 corresponding thereto.

In this way, after threading through the lower plate through hole, the conducting wire may be directly connected to the second conductor; and after threading through the second connection hole, the conducting wire may be directly connected to the third conductor. Lengths of wires may be short.

For example, as shown in FIG. 14 and FIG. 15, a distance between the lower plate through hole 341 and the pin 500 connected to the tail end of the second conductor 420 is less than a distance between the upper plate through hole 331 and the pin 500 connected to the tail end of the second conductor 420.

In this way, the second conductor may be set to short for ease of packaging of the laser transmitter.

For example, as shown in FIG. 14 and FIG. 15, the upper plate through hole 331 and the second connection hole 321 are straight up-and-down holes, and the second connection hole 321 is located over the corresponding upper plate through hole 331.

In this way, connection between the third conductor and the transfer conductor corresponding thereto is implemented by means of a conducting wire passing through the corresponding second connection hole and the upper plate through hole, so that connection between the third conductor and the transfer conductor corresponding thereto becomes more concise, and assembling of the laser transmitter becomes simpler and easier.

For example, the first conductor as the signal wire is in a microstrip structure.

Obviously, a person skilled in the art can make various variations and modifications on the embodiments of the present disclosure without departing from the spirit and scope of the present disclosure. Thus, if these variations and modifications of the present disclosure belong to the scope of the claims of the present disclosure and equivalent techniques thereof, the present disclosure is also intended to include these variations and modifications.

What is claimed is:

1. A laser transmitter, comprising:
   a heat sink, a laser disposed on the heat sink, and a connection apparatus comprising:
   a lower substrate, an upper surface thereof being disposed with a first conductor, and a lower surface thereof being disposed with a second conductor, and
   an upper substrate disposed on the lower substrate, an upper surface thereof being disposed with a third conductor, and the third conductor being connected to the second conductor,
   wherein the heat sink is disposed on a side of the lower substrate that is close to an end of the first conductor; and the laser is connected to an end of the first conductor that is close to the heat sink.

2. The laser transmitter according to claim 1, wherein the lower surface further comprises a first connection hole;
   the upper substrate further comprises a second connection hole; and
   the third conductor is connected to the second conductor by means of a conducting wire passing through the second connection hole and the first connection hole.

3. The laser transmitter according to claim 2, wherein the laser is connected to the end of the first conductor that is close to the heat sink by means of a gold wire.

4. The laser transmitter according to claim 3, wherein the first connection hole and the second connection hole are through holes; and the third conductor is connected to the second conductor via the conducting wire passing through the second connection hole and the first connection hole.

5. The laser transmitter according to claim 4, wherein an opening of the first connection hole on the lower surface of the lower substrate forms at the second conductor; and an opening of the second connection hole on the upper surface of the upper substrate forms at the third conductor.

6. The laser transmitter according to claim 5, wherein an opening of the first connection hole on the upper surface of the lower substrate is staggered with the first conductor.

7. The laser transmitter according to claim 6, wherein the second connection hole and the first connection hole are straight up-and-down holes.

8. The laser transmitter according to claim 7, wherein the second connection hole is located over the first connection hole, or the second connection hole and the first connection hole are through.

9. The laser transmitter according to claim 3, wherein the lower substrate comprises an upper plate and a lower plate, and a transfer conductor is disposed between the upper plate and the lower plate;

wherein the first connection hole comprises an upper plate through hole and a lower plate through hole staggered therewith; the second connection hole is a through hole; and wherein the third conductor is connected to the transfer conductor by means of the conducting wire passing through the second connection hole and the upper plate through hole, and the transfer conductor is connected to the second conductor by means of the conducting wire passing through the lower plate through hole.

10. The laser transmitter according to claim 9, wherein an opening of the lower plate through hole on a lower surface of the lower plate forms at the second conductor, and an opening of the second connection hole on the upper surface of the upper substrate forms at the third conductor.

11. The laser transmitter according to claim 10, wherein an end of the second conductor that is far from the heat sink is connected to a pin; and a distance between the lower plate through hole and the pin connected to the end of the second conductor that is far from the heat sink is less than a distance between the upper plate through hole and the pin connected to the end of the second conductor that is far from the heat sink.

12. The laser transmitter according to claim 11, wherein the upper plate through hole and the second connection hole are straight up-and-down holes, and the second connection hole is located over the upper plate through hole.

* * * * *